United States Patent
Shi

(10) Patent No.: US 10,403,686 B2
(45) Date of Patent: Sep. 3, 2019

(54) COLOR FILM SUBSTRATE AND DISPLAY DEVICE

(71) Applicant: Shenzhen China Star Optoelectronics Semiconductor Display Technology Co., Ltd., Shenzhen, Guangdong (CN)

(72) Inventor: Wen Shi, Guangdong (CN)

(73) Assignee: Shenzhen China Star Optoelectronics Semiconductor Display Technology Co., Ltd, Shenzhen, Guangdong (CN)

(*) Notice: Subject to any disclaimer, the term of this patent is extended or adjusted under 35 U.S.C. 154(b) by 0 days.

(21) Appl. No.: 15/739,770

(22) PCT Filed: Nov. 23, 2017

(86) PCT No.: PCT/CN2017/112444
§ 371 (c)(1),
(2) Date: Dec. 25, 2017

(87) PCT Pub. No.: WO2019/052002
PCT Pub. Date: Mar. 21, 2019

(65) Prior Publication Data
US 2019/0088723 A1   Mar. 21, 2019

(30) Foreign Application Priority Data

Sep. 15, 2017   (CN) .......................... 2017 1 0839434

(51) Int. Cl.
*H01L 27/32* (2006.01)
*H01L 33/50* (2010.01)
(Continued)

(52) U.S. Cl.
CPC ........ *H01L 27/322* (2013.01); *H01L 27/3211* (2013.01); *H01L 33/06* (2013.01);
(Continued)

(58) Field of Classification Search
None
See application file for complete search history.

(56) References Cited

U.S. PATENT DOCUMENTS

2003/0034486 A1* 2/2003 Korgel .................. B82Y 10/00
257/13
2015/0286097 A1* 10/2015 Lee .................... G02F 1/133617
349/61
(Continued)

FOREIGN PATENT DOCUMENTS

CN   106990595 A   7/2017
JP   2017125899 A   7/2017

*Primary Examiner* — Michelle Mandala
(74) *Attorney, Agent, or Firm* — Andrew C. Cheng

(57) ABSTRACT

The present invention provides a color film substrate and display device. The color film substrate comprises a bottom substrate; a black matrix disposed on the bottom substrate and a plurality of opening areas arranged in matrix at intervals are formed in the black matrix to be sub-pixel areas of the color film substrate; and a first conversion material layer formed within a first sub-pixel area of the sub-pixel areas, wherein the first conversion material layer converts an incident light with a first wavelength into a first emitting light with a second wavelength, and the first wavelength is greater than the second wavelength. The performance and lifetime of a display panel can be improved by this technique solution.

16 Claims, 3 Drawing Sheets

(51) Int. Cl.
*H01L 33/06* (2010.01)
*H01L 51/52* (2006.01)
*H01L 51/56* (2006.01)

(52) U.S. Cl.
CPC .......... *H01L 33/504* (2013.01); *H01L 33/505* (2013.01); *H01L 51/5284* (2013.01); *H01L 51/56* (2013.01); *H01L 2933/0041* (2013.01)

(56) References Cited

U.S. PATENT DOCUMENTS

2016/0003448 A1 1/2016 Dong et al.
2016/0356455 A1* 12/2016 Li ..................... G02F 1/133617
2017/0242292 A1 8/2017 Jeon et al.

* cited by examiner

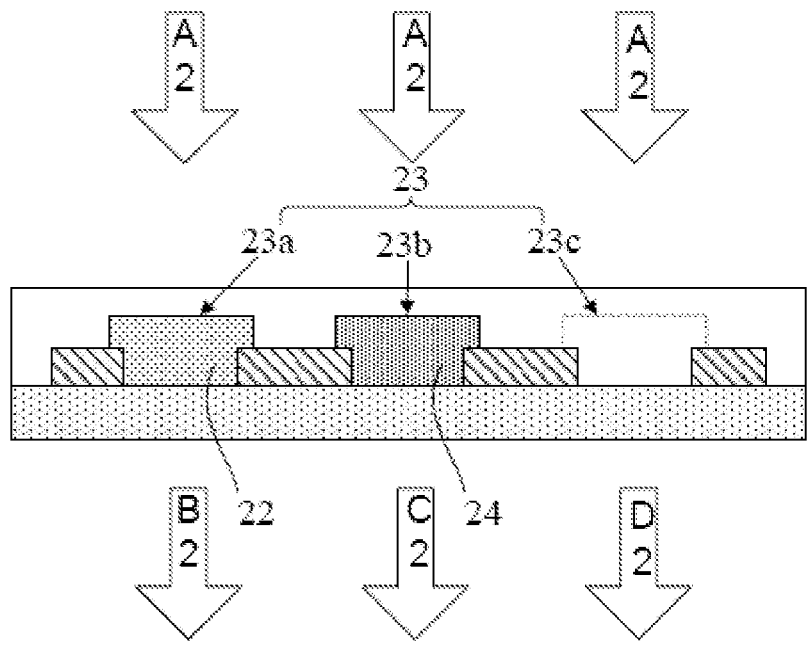

FIG. 3 disposing a black matrix on a bottom substrate and forming a plurality of opening areas arranged at intervals in matrix formation to be sub-pixel areas of the color film substrate — 40 manufacturing up-converting nanoparticles for emitting green light in the opening area of the black matrix corresponding to a green sub-pixel area of the sub-pixel areas — 41 manufacturing up-converting nanoparticles for emitting blue light in the opening area of the black matrix corresponding to a blue sub-pixel area of the sub-pixel areas — 42 encapsulating the whole color film to form a color film panel — 43

FIG. 4

COLOR FILM SUBSTRATE AND DISPLAY DEVICE

FIELD OF THE DISCLOSURE

The disclosure relates to a flat panel display technique, and more particularly to a color film substrate and display device.

BACKGROUND

Flat panel display devices with thin body, power, no radiation and many other advantages have been widely used. The existing active light-emitting display panels include organic light emitting displays (OLEDs) and quantum dot light emitting diodes displays (QLEDs). Compared with the liquid crystal displays (LCDs), the OLEDs and QLEDs have the advantages of self-illuminating, wide viewing angle, low power consumption, high responding speed, etc. over the LCDs, and are widely used.

The inventor of the present application finds out in a long-term research that, in the existed technologies, two methods are applied to accomplish color displaying. One of the methods is to accomplish color displaying by using RGB sub-pixels manufactured by vapor deposition or printing processes such as fine metal mask (FMM). The vapor deposition process is with high cost and difficult in achieving large-scale production, and the printing process is difficult in achieving high resolution. Another method is to add a color film on light sources, such as combining blue OLEDs and blue QLEDs with photoluminescence color filter (CF), so that better color gamut and higher light source utilization can be achieved. However, the blue OLEDs and blue QLEDs are with lower performance and shorter lifetime.

SUMMARY

A primary technique problem to be solved by the present invention is to provide a color film substrate and display device to improve performance and lifetime of a display panel therethrough.

In order to solve the technique problem mentioned above, one technique solution adopted by the present invention is to provide a method for manufacturing a color film substrate, comprising: disposing a black matrix on a bottom substrate and forming a plurality of opening areas arranged in matrix at intervals to be sub-pixel areas of the color film substrate; manufacturing a photoluminescence quantum dot film for down converting red light in the opening area of the black matrix corresponding to a red sub-pixel area of the sub-pixel areas; manufacturing a film comprising up-converting nanoparticles for emitting blue light in the opening area of the black matrix corresponding to a blue sub-pixel area of the sub-pixel areas; and encapsulating the bottom substrate and the black matrix to form the color film substrate.

In order to solve the technique problem mentioned above, one technique solution adopted by the present invention is to provide a color film substrate, comprising: a bottom substrate; a black matrix disposed on the bottom substrate and a plurality of opening areas arranged in matrix at intervals are formed in the black matrix to be sub-pixel areas of the color film substrate; and a first conversion material layer formed within a first sub-pixel area of the sub-pixel areas, wherein the first conversion material layer converts an incident light with a first wavelength into a first emitting light with a second wavelength, and the first wavelength is greater than the second wavelength.

In order to solve the technique problem mentioned above, another technique solution adopted by the present invention is to provide a display device comprising any one of the color film substrates described above.

The beneficial effect of the present invention is: through forming the black matrix as a plurality of opening areas arranged in matrix at intervals to be sub-pixel areas of the color film substrate and forming a first conversion material layer within first sub-pixel areas to convert an incident light with a first wavelength into an emitting light with a wavelength shorter than the first wavelength after the incident light passes the first conversion material layer, the color displaying of the display panel is accomplished and the performance and lifetime of the display panel is improved.

BRIEF DESCRIPTION OF THE DRAWINGS

FIG. 3 is a structural schematic diagram of the color film substrate according to another embodiment of the present invention.

FIG. 4 is a flow chart of the method for manufacturing the color film substrate according to one embodiment of the present invention.

DETAILED DESCRIPTION OF PREFERRED EMBODIMENTS

The present invention will be further described in detail with reference to accompanying drawings and embodiments as follows.

Figure 1:
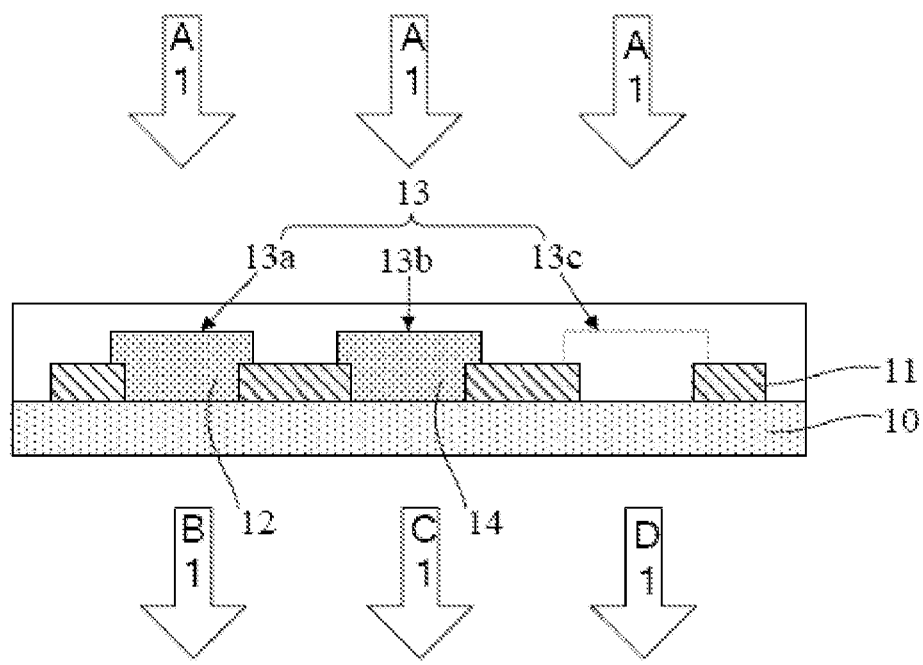
FIG. 1 is a structural schematic diagram of the color film substrate according to one embodiment of the present invention.

Please refer to FIG. 1, which is a structural schematic diagram of the color film substrate according to one embodiment of the present invention. As shown in FIG. 1, the color film substrate comprises a bottom substrate 10, a black matrix 11 and a first conversion material layer 12.

Figure 2:
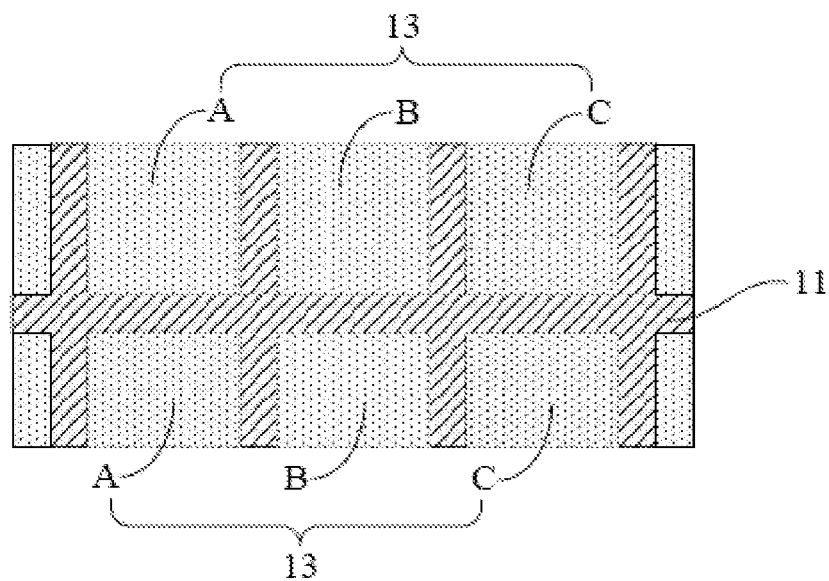
FIG. 2 is a structural schematic diagram of a top view of the FIG. 1.

The black matrix 11 is formed on the bottom substrate 10 to comprises a plurality of opening areas arranged at intervals in matrix formation. The opening areas are used as the sub-pixel areas 13 of the color film substrate. As shown in FIG. 1, the color film substrate comprises three sub-pixel areas 13a, 13b and 13c. Wherein, the black matrix 11 is mainly for preventing light leakage between pixels and for increasing color contrast, and the materials for forming the black matrix 11 could be metal thin films and resins, such as oxide film or black photoresist film. As shown in FIG. 2, which is a structural schematic diagram of a top view of the FIG. 1, the black matrix 11 is disposed on the bottom substrate and is formed to comprise opening areas A/B/C arranged at intervals in a matrix formation, and the opening areas A/B/C are used as the sub-pixel areas 13 of the color film substrate.

Furthermore, the first conversion material layer 12 is formed within the first sub-pixel area 13a of the sub-pixel areas 13. The first conversion material layer 12 converts an incident light A1 with a first wavelength into a first emitting light B1 with a second wavelength, wherein the first wavelength is greater than the second wavelength.

Specifically, the incident light A1 with the first wavelength could be a red light, and the first conversion material layer 12 could comprise up-converting nanoparticles comprising inorganic base material and doped rare earth ions. The first emitting light B1 with the second wavelength could be green light or blue light, and the up-converting nanoparticles could convert the injected red light into green light or blue light, wherein, the wavelength of the red light is greater than the wavelength of the green light or the blue light.

In another embodiment, the incident light A1 with the first wavelength could be a green light, and the first conversion material layer 12 could comprise up-converting nanoparticles comprising inorganic base material and doped rare earth ions. The first emitting light B1 with the second wavelength could be blue light, and the up-converting nanoparticles could convert the injected green light into blue light, wherein, the wavelength of the green light is greater than the wavelength of the blue light.

Through the solutions described above, the active light-emitting units with high performance and longer wavelength could be applied with specific conversion materials to achieve full color display to improve performance and lifetime of the display panel.

Furthermore, as shown in FIG. 1, the color film substrate further comprises a second conversion material layer 14. The second conversion material layer 14 is formed within the second sub-pixel area 13b of the sub-pixel areas 13, and converts the incident light A1 into a second emitting light C1 with a third wavelength, wherein the first wavelength is greater than the third wavelength.

Optionally, at least one of the first conversion material layer 12 and second conversion material layer 14 comprises up-converting nanoparticles comprising inorganic base material and doped rare earth ions.

In the present embodiment, the emitting light with wavelengths smaller than the wavelengths of the incident light could be excited through the up-converting nanoparticles. For example, green light or blue light could be excited by using red light, and blue light could be excited by using green light.

Usually, the up-converting nanoparticles are composed of inorganic base material and doped rare earth ions embedded in the inorganic base material. Wherein, the up-converting procedure relies mainly upon the stepped energy level of the doped rare earth ions. At the same time, crystal structure and optical property of the base material is also important for increasing efficiency of up-converting. Therefore, selection of base material is very important. The difference between crystal structures of the base material would result in variations of crystal field near the excited ions and would cause variations of the optical property of the nanoparticles. Therefore, in the present embodiment, a base material having better transmittance for light having wavelengths within a specific range is selected. The inorganic base material comprises and is not limited to halides, oxides, sulfides, and sulfur oxides. The doped rare earth ions comprise and are not limited to $Er^{3+}$, $Ho^{3+}$, $Tm^{3+}$, $Pr^{3+}$, $Nd^{3+}$ or $Yb^{3+}$.

Optionally, the incident light A1 is red light and the first emitting light B1 and second emitting light C1 are blue light and green light, respectively. The third sub-pixel area 13c of the sub-pixel areas is formed to transmit at least a part of the incident light to be the third emitting light D1.

In the present embodiment, the incident light A1 with the first wavelength is red light, the first emitting light B1 with the second wavelength is blue light, the second emitting light C1 with the third wavelength is green light, and the third emitting light D1 is red light. Wherein, the wavelength of the red light is greater than the wavelength of the blue light and the green light. The first conversion material layer 12 and the second conversion material layer 14 both comprise up-converting nanoparticles comprising inorganic base material and doped rare earth ions, and are formed within the first sub-pixel area 13a and the second sub-pixel area 13b, respectively.

In one application, the first sub-pixel area 13a is a blue sub-pixel area formed with up-converting nanoparticles emitting blue light, the second sub-pixel area 13b is a green sub-pixel area formed with up-converting nanoparticles emitting green light, and the third sub-pixel area 13c is a red sub-pixel area formed as a light transparent area. When a red light with wavelength $\lambda_1$ is emitted from the red-light emitter on a light-emitting panel, the red light excites the up-converting nanoparticles in the blue sub-pixel area on the color film panel to emit blue light with wavelength $\lambda_2$, the red light excites the up-converting nanoparticles in the green sub-pixel area on the color film panel to emit green light with wavelength $\lambda_3$, and the red light transmitted through the red sub-pixel area is combined with the blue light and green light to achieve full color display. Wherein the wavelength $\lambda_1$ of the red light is greater than the wavelength $\lambda_2$ of the green light and the wavelength $\lambda_3$ of the blue light.

Through the solutions described above, the red OLED or QLED having high performance and long lifetime is used as the active light-emitting units, and full color display could be achieved by combining the up-converting nanoparticles to excite the green/blue up-converting nanoparticles by the red OLED or QLED, so that the lifetime of the display panel can be increased.

Please refer to FIG. 3, which is a structural schematic diagram of the color film substrate according to another embodiment of the present invention. The color film substrate further comprises a second conversion material layer 24 is formed within the second sub-pixel area 23b of the sub-pixel areas, and converts the incident light A2 into the second emitting light C2 with the third wavelength, wherein the first wavelength is smaller than the third wavelength.

Optionally, the first conversion material layer 22 are up-converting nanoparticles comprising inorganic base material and doped rare earth ions, and the second conversion material layer 24 are down-converting quantum dot material. The down-converting quantum dot material could emit a light while being excited by an incident light whose wavelength is smaller than that of the emitted light. For example, the red light could be emitted when the down-converting quantum dot material is excited by the green light.

Optionally, the incident light A2 above is a green light, the first emitting light B2 and second emitting light C2 are blue light and red light, respectively, and the third sub-pixel area 23c of the sub-pixel areas is formed to transmit at least part of the incident light to be the third emitting light D2.

In the present embodiment, the incident light A2 with the first wavelength is the green light, the first emitting light B2 with the second wavelength is the blue light, the second emitting light C2 with the third wavelength is the red light, and the third emitting light D2 is the green light. Wherein, the wavelength of the green light is greater than the wavelength of the blue light, and the wavelength of the green light is smaller than the wavelength of the red light. The first conversion material layer 22 are up-converting nanoparticles comprising inorganic base material and doped rare earth ions and are formed within the first sub-pixel area 23a of the sub-pixel areas, and the second conversion material layer 24 are down-converting quantum dot material and are formed within the second sub-pixel area 23b of the sub-pixel areas.

In another application, the first sub-pixel area 23a is a blue sub-pixel area and is formed with up-converting nanoparticles emitting blue lights, the second sub-pixel area 23b is a red sub-pixel area and is formed with photoluminescence quantum dot material for down-converting red light, and the third sub-pixel area 23c is a green sub-pixel area formed to be a light transparent area. When a green light with wavelength $\lambda_1$ is emitted from the green-light emitter on the light-emitting panel, the green light excites the down-converting quantum dot material in the red sub-pixel area on the color film panel to emit red light with wavelength $\lambda_3$, the green light excites the up-converting nanoparticles in the blue sub-pixel area on the color film panel to emit blue light with wavelength $\lambda_2$, and the green light transmitted through the green sub-pixel area is combined with the blue light and red light to achieve full color display. Wherein the wavelength $\lambda_1$ of the green light is greater than the wavelength $\lambda_2$ of the blue light and is smaller than the wavelength $\lambda_3$ of the red light.

Through the solutions described above, the green OLED or QLED having high performance and long lifetime is used as the active light-emitting units. Full color display could be achieved by combining the down-converting red-light photoluminescence quantum dot material and the up-converting nanoparticles to excite the photoluminescence quantum dot material for emitting red light and excite blue up-converting nanoparticles for blue light by the green OLED or QLED so that the lifetime of the display panel can be increased.

Please refer to FIG. 4, which is a flow chart of the method for manufacturing the color film substrate according to one embodiment of the present invention. In the present embodiment, the method for manufacturing the color film substrate comprises the following steps:

S40: disposing a black matrix on a bottom substrate and forming a plurality of opening areas arranged at intervals in matrix formation to be sub-pixel areas of the color film substrate;

S41: manufacturing up-converting nanoparticles for emitting green light in the opening area of the black matrix corresponding to a green sub-pixel area of the sub-pixel areas;

S42: manufacturing up-converting nanoparticles for emitting blue light in the opening area of the black matrix corresponding to a blue sub-pixel area of the sub-pixel areas;

S43: encapsulating the whole color film to form a color film panel.

Figure 5:
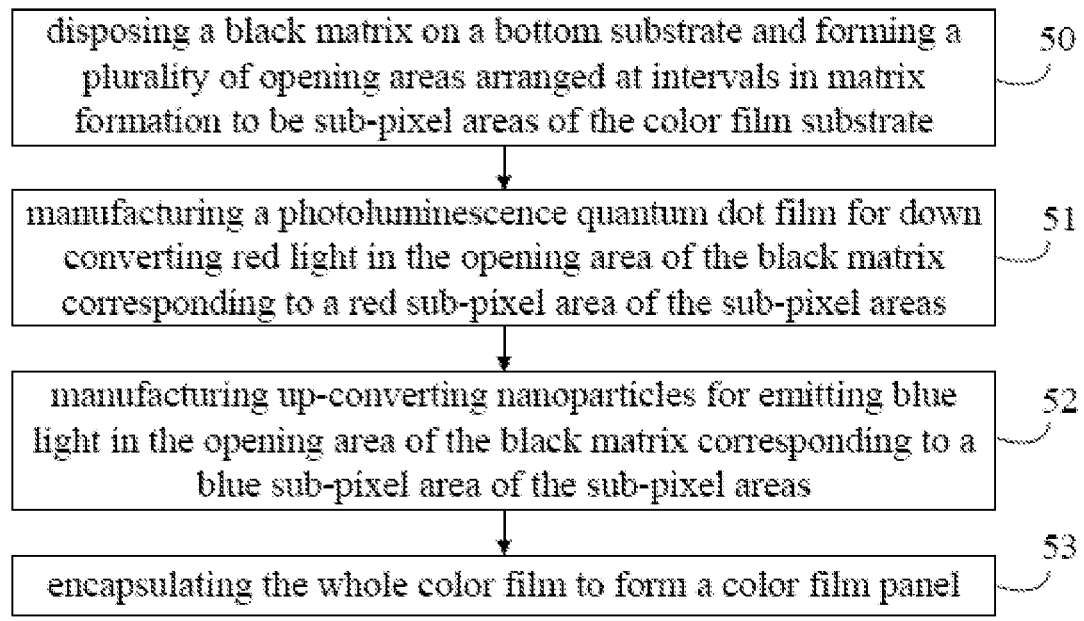
FIG. 5 is a flow chart of the method for manufacturing the color film substrate according to another embodiment of the present invention.

Please refer to FIG. 5, which is a flow chart of the method for manufacturing the color film substrate according to another embodiment of the present invention. In the present embodiment, the method for manufacturing the color film substrate comprises the following steps:

S50: disposing a black matrix on a bottom substrate and forming a plurality of opening areas arranged at intervals in matrix formation to be sub-pixel areas of the color film substrate;

S51: manufacturing a photoluminescence quantum dot film for down converting red light in the opening area of the black matrix corresponding to a red sub-pixel area of the sub-pixel areas;

S52: manufacturing up-converting nanoparticles for emitting blue light in the opening area of the black matrix corresponding to a blue sub-pixel area of the sub-pixel areas;

S53: encapsulating the whole color film to form a color film panel.

Figure 6:
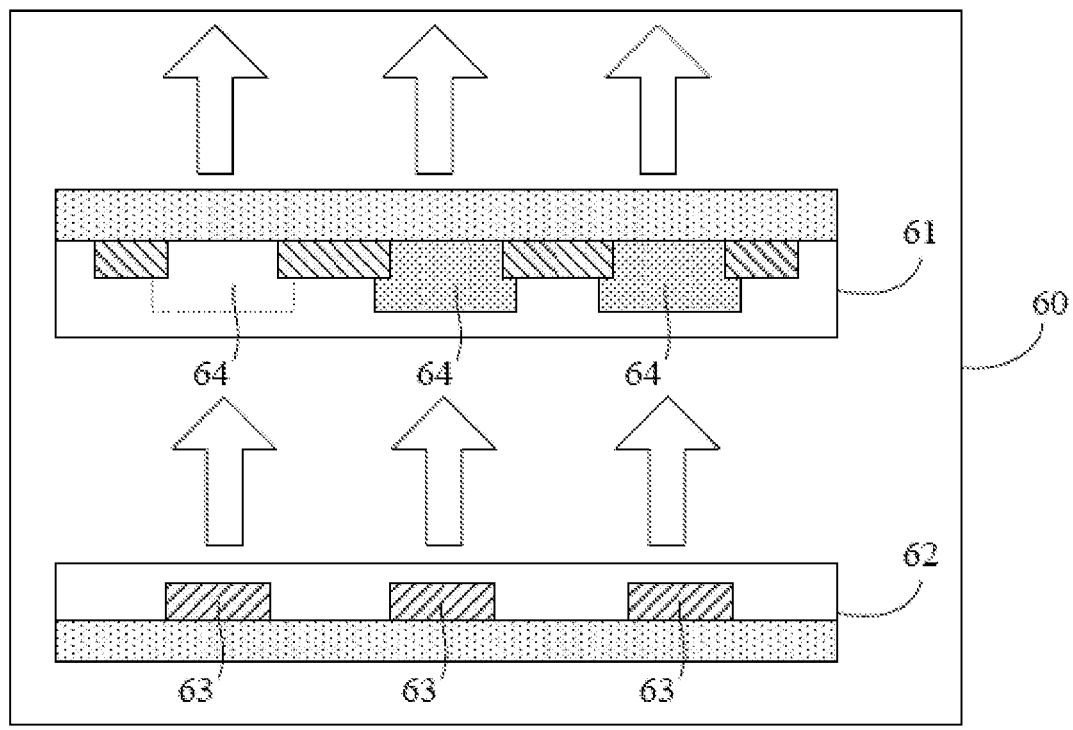
FIG. 6 is a structural schematic diagram of the display device according to one embodiment of the present invention.

The present invention further comprises a display device as shown in FIG. 6. The display device 60 comprises a color film substrate 61 having any one of the structures shown above, or a color film substrate 61 being manufactured by any one of the methods described above. The concrete methods are described as the embodiments above, and the methods can be applied to manufacture the color film substrate shown in FIG. 1 or FIG. 3 which are not described again here. Furthermore, the display device 61 further comprises an active light-emitting array substrate 62 comprising a plurality of light-emitting areas 63, wherein the light-emitting areas 63 are corresponding to the sub-pixel areas 64 to provide the incident light to the sub-pixel areas 64, respectively.

Specifically, reflective electrodes (not shown in the figure), light-emitters within the light-emitting areas 63 on the reflective electrodes and the encapsulation layer are disposed above the array substrate 62 in the FIG. 6. The light-emitters could be green or red OLED/QLED active light-emitting units as described above, and the encapsulation layer could be packaging cover plate or TFE (thin film encapsulation) packaging layer.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A method for manufacturing a color film substrate, comprising
   disposing a black matrix on a bottom substrate and forming a plurality of opening areas arranged in matrix at intervals to be sub-pixel areas of the color film substrate;
   manufacturing a photoluminescence quantum dot film for down converting red light in the opening area of the black matrix corresponding to a red sub-pixel area of the sub-pixel areas;
   manufacturing a film comprising up-converting nanoparticles for emitting blue light in the opening area of the black matrix corresponding to a blue sub-pixel area of the sub-pixel areas; and
   encapsulating the bottom substrate and the black matrix to form the color film substrate.

2. The method according to claim 1, wherein,
   the up-converting nanoparticles comprise inorganic base material and doped rare earth ions and are capable of exciting a first emitting light with a wavelength greater than the wavelength of a first incident light injected into the up-converting nanoparticles; and
   the photoluminescence quantum dot film is composed of down-converting quantum dot material being capable of exciting a second emitting light with the wavelength smaller than the wavelength of a second incident light injected into the up-converting nanoparticles.

3. The method according to claim 2, wherein the first and second incident light is green light, the first emitting light is blue light, and the second emitting light is red light.

4. The method according to claim 3, further comprising:
   manufacturing a transparent film capable of transmitting at least a part of light incident into the transparent film in the opening area of the black matrix corresponding to a green sub-pixel area of the sub-pixel areas.

5. A color film substrate, comprising:
a bottom substrate;
a black matrix disposed on the bottom substrate and a plurality of opening areas arranged in matrix at intervals are formed in the black matrix to be sub-pixel areas of the color film substrate; and
a first conversion material layer formed within a first sub-pixel area of the sub-pixel areas, wherein the first conversion material layer converts an incident light with a first wavelength into a first emitting light with a second wavelength, and the first wavelength is greater than the second wavelength;
wherein the color film substrate further comprises a second conversion material layer, the second conversion material layer is formed within a second sub-pixel area of the sub-pixel areas and converts the incident light into a second emitting light with a third wavelength, and the first wavelength is greater than the third wavelength;
wherein at least one of the first conversion material layer and the second conversion material layer comprises up-converting nanoparticles comprising inorganic base material and doped rare earth ions.

6. The color film substrate according to claim 5, wherein the incident light is red light, and the first emitting light and second emitting light are blue light and green light, respectively.

7. The color film substrate according to claim 5, wherein the color film substrate further comprises a second conversion material layer, the second conversion material layer is formed within a second sub-pixel area of the sub-pixel areas and converts the incident light into a second emitting light with a third wavelength, and the first wavelength is smaller than the third wavelength.

8. The color film substrate according to claim 7, wherein the incident light is green light, and the first emitting light and second emitting light are blue light and red light, respectively.

9. The color film substrate according to claim 7, wherein the first conversion material layer comprises up-converting nanoparticles comprising inorganic base material and doped rare earth ions, and the second conversion material layer comprises down-converting quantum dot materials.

10. The color film substrate according to claim 9, wherein a third sub-pixel area of the sub-pixel areas is formed to transmit at least a part of the incident light to be a third emitting light.

11. A display device, wherein the display device comprises a color film substrate, and the color film substrate comprises:
a bottom substrate;
a black matrix disposed on the bottom substrate and a plurality of opening areas arranged in matrix at intervals are formed in the black matrix to be sub-pixel areas of the color film substrate; and
a first conversion material layer formed within a first sub-pixel area of the sub-pixel areas, wherein the first conversion material layer converts an incident light with a first wavelength into a first emitting light with a second wavelength, and the first wavelength is greater than the second wavelength;
wherein the color film substrate further comprises a second conversion material layer, the second conversion material layer is formed within a second sub-pixel area of the sub-pixel areas and converts the incident light into a second emitting light with a third wavelength, and the first wavelength is greater than the third wavelength;
wherein at least one of the first conversion material layer and the second conversion material layer comprises up-converting nanoparticles comprising inorganic base material and doped rare earth ions.

12. The display device according to claim 11, wherein the incident light is red light, and the first emitting light and second emitting light are blue light and green light, respectively.

13. The display device according to claim 11, wherein the color film substrate further comprises a second conversion material layer, the second conversion material layer is formed within a second sub-pixel area of the sub-pixel areas and converts the incident light into a second emitting light with a third wavelength, and the first wavelength is smaller than the third wavelength.

14. The display device according to claim 13, wherein the incident light is green light, and the first emitting light and second emitting light are blue light and red light, respectively.

15. The display device according to claim 13, wherein the first conversion material layer comprises up-converting nanoparticles comprising inorganic base material and doped rare earth ions, and the second conversion material layer comprises down-converting quantum dot materials.

16. The display device according to claim 15, wherein the display device comprises an active light-emitting array substrate comprising a plurality of light-emitting areas, wherein the light-emitting areas are corresponding to the sub-pixel areas to provide the incident light to the sub-pixel areas, respectively.

* * * * *